US012738957B2

(12) United States Patent
Piewek et al.

(10) Patent No.: US 12,738,957 B2
(45) Date of Patent: Sep. 15, 2026

(54) METHOD FOR PROCESSING DATA SETS CONTAINING AT LEAST ONE TIME SERIES, DEVICE FOR CARRYING OUT, VEHICLE AND COMPUTER PROGRAM

(71) Applicant: VOLKSWAGEN AKTIENGESELLSCHAFT, Wolfsburg (DE)

(72) Inventors: Jan Piewek, Magdeburg (DE); Konstantin Jonas, Berlin (DE)

(73) Assignee: VOLKSWAGEN AKTIENGESELLSCHAFT (DE)

( * ) Notice: Subject to any disclaimer, the term of this patent is extended or adjusted under 35 U.S.C. 154(b) by 1049 days.

(21) Appl. No.: 17/905,439

(22) PCT Filed: Feb. 12, 2021

(86) PCT No.: PCT/EP2021/053473
§ 371 (c)(1),
(2) Date: Sep. 1, 2022

(87) PCT Pub. No.: WO2021/175568
PCT Pub. Date: Sep. 10, 2021

(65) Prior Publication Data
US 2023/0111292 A1 Apr. 13, 2023

(30) Foreign Application Priority Data
Mar. 2, 2020 (DE) ..................... 10 2020 202 625.4

(51) Int. Cl.
*H03M 7/30* (2006.01)
*H03M 7/24* (2006.01)

(52) U.S. Cl.
CPC ............ *H03M 7/3059* (2013.01); *H03M 7/24* (2013.01)

(58) Field of Classification Search
CPC ....... H03M 7/30; H03M 7/3059–3062; H03M 7/3091; G08G 1/123–127; G08G 1/133; G08G 1/161–163
See application file for complete search history.

(56) References Cited

U.S. PATENT DOCUMENTS 5,525,982 A 6/1996 Cheng et al.
6,839,003 B2 1/2005 Soliman et al.
(Continued)

FOREIGN PATENT DOCUMENTS

CN 105553483 A 5/2016
DE 10021286 A1 11/2001
(Continued)

OTHER PUBLICATIONS

Box Plot; Wikipedia; downloaded from https://en.wikipedia.org/index.php?title=Box_plot&oldid=943309261; downloaded Apr. 20, 2021; originally published prior to Feb. 12, 2021.
(Continued)

*Primary Examiner* — Matthew D Sandifer
(74) *Attorney, Agent, or Firm* — BARNES & THORNBURG LLP

(57) ABSTRACT

A method for processing data sets having at least one time series. These are measurement values of sensors that are sensed at certain times. The data of the measured values and the respective times at which the data were sensed are stored as data elements of the time series. The method compresses the data set by rounding the sensed data with subsequent decimation of the data elements of the data set which are contained in the time series.

17 Claims, 10 Drawing Sheets

(56) References Cited

U.S. PATENT DOCUMENTS

| | | | | |
|---|---|---|---|---|
| 9,520,894 | B1 | 12/2016 | Liaghati | |
| 2001/0038347 | A1 | 11/2001 | Avery et al. | |
| 2009/0300039 | A1 | 12/2009 | Stengelin | |
| 2014/0161139 | A1 * | 6/2014 | Evans | H04L 69/04 370/465 |
| 2018/0253559 | A1 | 9/2018 | Satpathy et al. | |
| 2018/0365298 | A1 * | 12/2018 | Poghosyan | G06F 11/3419 |
| 2018/0365301 | A1 * | 12/2018 | Poghosyan | G06F 16/2477 |
| 2021/0019292 | A1 * | 1/2021 | Kholodkov | G06F 16/215 |

FOREIGN PATENT DOCUMENTS

| | | | | |
|---|---|---|---|---|
| EP | 2645318 | A1 | 10/2013 | |
| EP | 3522557 | A1 | 8/2019 | |
| JP | 7689093 | B2 * | 6/2025 | G06T 9/002 |
| WO | 2014114506 | A1 | 7/2014 | |

OTHER PUBLICATIONS

Compression by Scaling and Offset; downloaded from https://www.unidata.ucar.edu/blogs/developer/entry/compression_by_scaling_and_offset; downloaded Apr. 20, 2021; originally published prior to Feb. 12, 2021.

Downsampling (Signal Processing); Wikipedia; downloaded from https://en.wikipedia.org/index.php?title=Downsampling_(signal_processing)&oldid=943354289; downloaded Apr. 16, 2021; originally published prior to Feb. 12, 2021.

MISB: Motion Imagery Standards Board; Floating Point to Integer Mapping; MISB ST 1201.1; Feb. 27, 2014.

Search Report for International Patent Application No. PCT/EP2021/053473; Apr. 29, 2021.

* cited by examiner

S10
MEM
S12
RS
S15
BISCO
P10
S16
CS
S18
MBP A
S20
B/D A
S22
OBD
BCDA
S24
Tx
T200
S26
COMP
Ax
P320
S34
MBP A
S36
B/D A
S38
CD
S40
SS A
S42
PR A
S44
O A
S46
BISCO
Dec
S48
DS

| Index „x“ | 0 | 1 | 2 | 3 | 4 | 5 | 6 | 7 | 8 |
|---|---|---|---|---|---|---|---|---|---|
| t(x) | 0 | 10 | 20 | 30 | 40 | 50 | 60 | 70 | 80 |
| int(x) „DEC“ | 0 | 1 | 0 | 3 | 5 | 8 | 5 | 4 | 5 |
| fp(x) | 0.0 | 0.01 | 0.0 | 0.03 | 0.05 | 0.08 | 0.05 | 0.04 | 0.05 |

| DEC | BIN | DEC | DEC |
|---|---|---|---|
| „int" | „int" | „rnd" | „comp" |
| 0 | 0 0 0 0 | 0 | 0 |
| 1 | 0 0 0 1 | 0 | 0 |
| 2 | 0 0 1 0 | 1 | 1 |
| 3 | 0 0 1 1 | 1 | 1 |
| 4 | 0 1 0 0 | 0 | 1 |
| 5 | 0 1 0 1 | 0 | 1 |
| 6 | 0 1 1 0 | 1 | 2 |
| 7 | 0 1 1 1 | 1 | 2 |
| 8 | 1 0 0 0 | 0 | 2 |
| ... | ... | ... | ... |

rnd

Fig. 8

| Index „x" | 0 | 1 | 2 | 3 | 4 | 5 | 6 | 7 | 8 |
|---|---|---|---|---|---|---|---|---|---|
| t(x) | 0 | 10 | 20 | 30 | 40 | 50 | 60 | 70 | 80 |
| int(x) „DEC" | 0 | 1 | 0 | 3 | 5 | 8 | 5 | 4 | 5 |
| comp(x) | 0 | 0 | 0 | 1 | 1 | 2 | 1 | 1 | 1 |
| last | 0 | | | 1 | | 2 | 1 | | |
| Tx | x | | | x | | x | x | | |

Fig. 9

| Index „c" | 0 | 1 | 2 | 3 |
|---|---|---|---|---|
| t(c) | 0 | 30 | 50 | 60 |
| comp(c) | 0 | 1 | 2 | 1 |
| fp(c) | 0 | 0.04 | 0.08 | 0.04 |

Fig. 10

| Index „x" | fp(x) | Description |
|---|---|---|
| 0 | 0.0 | min |
| 2 | 0.0 | - |
| 1 | 0.01 | Q25 |
| 3 | 0.03 | - |
| 7 | 0.04 | Median |
| 4 | 0.05 | - |
| 6 | 0.05 | Q75 |
| 5 | 0.08 | Max |

| Index „c“ | dt | rt | comp(c) | Description | fp(c) |
|---|---|---|---|---|---|
| 0 | 30 | 37,5% | 0 | min, Q25 | 0.0 |
| 1 | 20 | 50% | 1 | Median, Q75 | 0.04 |
| 3 | 20 | | 1 | | |
| 2 | 10 | 12,5% | 2 | Max | 0.08 |

METHOD FOR PROCESSING DATA SETS CONTAINING AT LEAST ONE TIME SERIES, DEVICE FOR CARRYING OUT, VEHICLE AND COMPUTER PROGRAM

PRIORITY CLAIM

This patent application is a U.S. National Phase of International Patent Application No. PCT/EP2021/053473, filed 12 Feb. 2021, which claims priority to German Patent Application No. 10 2020 202 625.4, filed 2 Mar. 2020, the disclosures of which are incorporated herein by reference in their entireties.

SUMMARY

Illustrative embodiments relate to the technical field of data compression and data analysis. Increasing amounts of data are now also being collected in transportation vehicles and transferred to external data centers where the data analysis can be carried out. Illustrative embodiments also relate to a correspondingly-designed device for data compression and/or data analysis, as well as to a transportation vehicle equipped with a corresponding device, and a correspondingly-designed computer program.

BRIEF DESCRIPTION OF THE DRAWINGS

Disclosed embodiments are shown in the drawings and are explained in more detail with reference to the figures, in which:

FIG. 8 shows a table showing the results for the calculation of the rounding information for the example data set according to the holistic approach, and the results of the rounding;

FIG. 9 shows the process of decimating the rounded data elements of the time series in the example of FIG. 6;

FIG. 10 shows the compressed data set after performing the decimation of the rounded data elements of the time series in tabular form;

DETAILED DESCRIPTION

Figure 1:
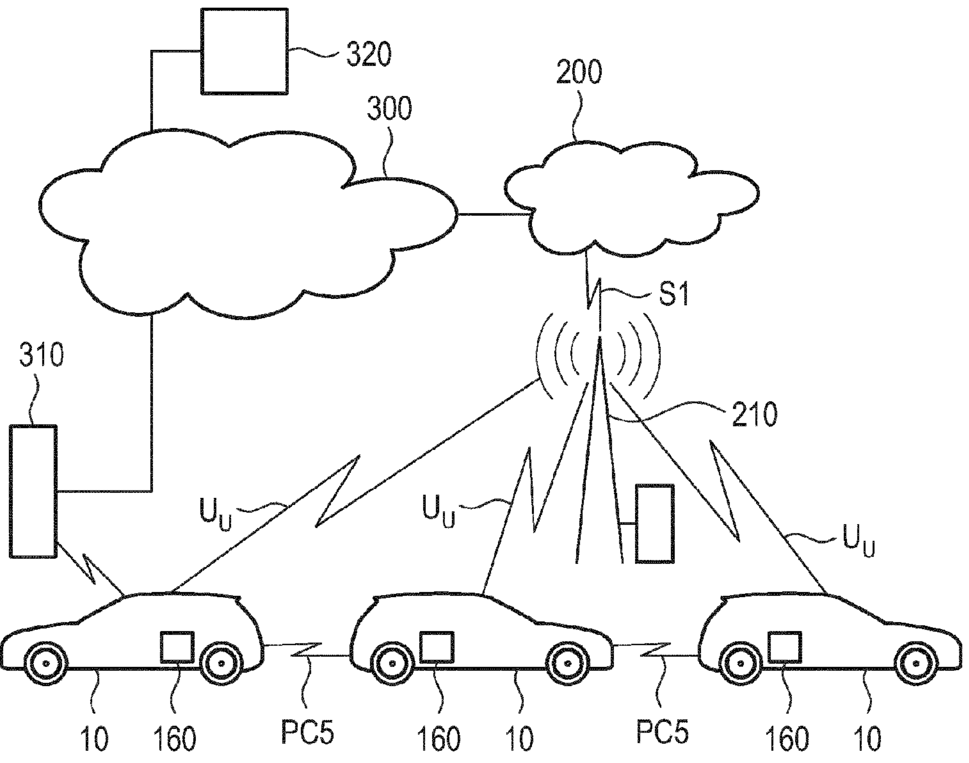
FIG. 1 shows the principle of vehicle-to-vehicle communication via mobile radio communications and internet connectivity.

With the development of new technologies for personal transport up to and including autonomous driving, it can be assumed for the near future that, due to the use of databases, improved transportation vehicle sensors, etc. ever greater amounts of data will need to be exchanged between transportation vehicles and between transportation vehicle and data center on the system side. This requires a massive expansion of the communication networks, as the transportation vehicles must exchange ever greater amounts of data among themselves via vehicle-to-vehicle communication V2V, but also with backend servers via vehicle-to-infrastructure communication V2X.

This means that an increasing amount of data is being transferred from transportation vehicles to the "cloud". The available bandwidth for V2X communication is limited. Therefore, one approach to resolving this conflict is to compress the data in the transportation vehicle and only transfer the compressed data to a backend server (in the "cloud").

A well-known compression method used for this is the ZIP method, which allows the large data sets of any kind of data to be compressed without loss.

Document US 2018/253559 A1 discloses a method for lossless payload compression. The payload compression uses entropy encoding, such as Huffman encoding and LZ77, corresponding to Lempel-Ziv 77. In at least one disclosed embodiment, selected parts of the payload are encrypted in a data block according to the AES method, corresponding to Advanced Encryption Standard, with Huffman-coded data indicating the beginning and the end of encryption limits. This enables the selective adoption of a higher level of security, as is required in certain applications.

The drawbacks of the known solutions have been recognized in the context of the present disclosure. The problem with the known solutions is that while they allow the raw data to be compressed, so that less storage space is needed to store the compressed data and less bandwidth of the communication system used is required to transmit the compressed data, an analysis of the compressed data requires considerable effort. In fact it requires a data decompression operation before the analysis is possible. This can lead to considerable additional costs with large data sets, which are collected, for example, for use in transportation vehicles or in machines and systems over their entire operating time. If the analysis of the data is carried out in the backend server, there is often enough computing power available to perform the decompression alongside the other tasks of the server. Nevertheless, this also incurs costs. However, the situation is different if the analysis itself is also to be carried out in the transportation vehicle or machine. For application in the transportation vehicle or on a machine, it is necessary, for example, to monitor the wear condition of wearing parts during operation. Here, the driver or the machine operator should be provided with as up-to-date information as possible regarding the need for maintenance. This is absolutely necessary in the case of safety-relevant wear parts. In a transportation vehicle, however, electronic control units are used that are equipped with microcontrollers, the computing power of which is limited. As mass-produced products, the control units are also subject to increased price pressure. In addition, the control units operate under real-time conditions, so that certain data analysis methods for which the calculation effort depends at least linearly on the number of data points to be analyzed cannot be executed, or only executed with additional computing power. A limitation could also arise from the need for data to be transmitted over an internal communication network in the transportation vehicle, the bandwidth of which is limited. In addition, in the best case the reconstructed data is the same size as the raw data. In the case of 1-bit status signals (e.g., driver's door closed/open) that are transmitted via a communication network of the transportation vehicle, such as the CAN bus (Controller Area Network), an analysis with the floating-point data type "64-bit double" means a memory increase by a factor of 64 compared to the original size, or a memory increase by a factor of 8 compared to an "8-bit unsigned integer" representation. The implementation and execution of the compression algorithm in a control unit of a transportation vehicle requires non-volatile memory for the program code, and volatile memory for the variables at runtime and computing time. Some compression methods are excluded for use in a control unit due to their resource requirements, or else they can only be used to compress a small number of signals.

But for "cloud applications" also, it is of interest to reduce the effort required for data analysis. For application in the transportation vehicle sector, the raw data in the transportation vehicle is compressed and decompressed again on the backend server side. Large-scale transportation vehicle manufacturers generate huge volumes of data that must be stored and processed in the backend. With millions of transportation vehicles built each year, it is easy to imagine that vast data centers need to be built to store and process all this data. It can also be beneficial if the required effort can be limited.

Furthermore, methods are known from EP 2 645 318 A1 and EP 3 522 577 A1 in which consecutive recorded data values are only stored permanently or transferred to a host computer if a difference from the last stored/transmitted data value is greater than a predefined threshold value.

There is therefore a need to develop an improved compression algorithm which requires fewer resources and allows variation in terms of compression level and loss rate, while reducing the effort required for decompression or data analysis.

Disclosed embodiments provide a method for processing data sets containing at least one time series, a device for carrying out the method, a transportation vehicle, and a computer program.

In a general form, the disclosed embodiments relate to a method for processing data sets containing at least one time series, wherein the time series contains the data acquired at specific times and the respective time of the data acquisition as data elements. The time of the data acquisition can be represented, for example, as an absolute time or as a delta time with respect to an absolute time, or as an index in the case of temporally equidistant data recording. These data sets are compressed according to the method in a special way, in which an operation of rounding the acquired data is performed with a subsequent decimation of the data elements of the data set contained in the at least one time series. The data compression method offers the benefits familiar from other known data compression methods, such as reduction of the amount of data to be stored or transmitted. In addition, the method offers the benefit that data analysis on the compressed data set is possible without the need to run a decompression algorithm. This is significant, as data often needs not only to be archived but also analyzed for maintenance purposes, to detect safety-critical developments, to adapt functions to the user's personal behaviors and preferences, if applicable for warranty purposes and to identify causes of accidents.

Specifically, a solution for the decimation operation consists of removing data elements, the rounded data value of which does not differ from the rounded data value of the immediate temporal predecessor. This means that high compression rates of >10 can be achieved for many time series in which the measurement value acquired barely changes.

A common usage case is that the time series corresponds to a series of measurement values, which are acquired as integer numbers or as floating-point numbers. In this case, it is beneficial for the compression method if an operation of conversion to integer numbers is performed before the compression method is applied.

For this purpose, it is beneficial for the conversion to integer numbers if the decimal places of the floating-point numbers of the data elements of the time series are converted to integer decimal numbers by shifting the decimal point, which are then converted to integer numbers in a further operation.

In addition, it is beneficial to run an algorithm that performs rounding of the integer numbers in preparation for decimating the data elements of the time series. Here it is possible to specify how large the effect of the rounding should be. This has a crucial influence on the degree of compression.

In another disclosed embodiment, the rounding operation is prepared according to the following rule:

$$\mathrm{rnd}(x)=\mathrm{AND}(\mathrm{BSR}(\mathrm{int}(x), n\mathrm{bit}-1), 1)$$

where rnd(x) corresponds to rounding information of the integer number that is selected for a subsequent rounding operation, where x corresponds to a data element index, where int(x) corresponds to the integer number, where nbit−1 indicates which integer bit position is to be selected for the calculation of the rounding information rnd(x) according to the rule specified above, where AND corresponds to a logical AND operation of the integer value "1" with the entry at the bit position determined by a right shift (BSR function) by the number nbit−1 of bit positions of the integer number int(x). The compression level can be set by selecting the nbit parameter.

The actual rounding operation can be performed according to the following rule:

$$\mathrm{comp}(x)=\mathrm{BSR}(\mathrm{int}(x), n\mathrm{bit})+\mathrm{rnd}(x),$$

where comp(x) corresponds to the resolution-reduced portion of the integer int(x) resulting from the rounding, and nbit is the number of bit positions by which the integer should be right-shifted before the addition with the rounding information rnd(x) is performed. By selecting the parameter nbit=0, the compression algorithm can be set to lossless compression. In this case, the rounding information rnd(x) does not need to be calculated, because it is zero.

After these preparation operations, the data elements of the data set can be decimated. It is helpful to compare the rounded values comp(x) and comp(x+1) and to delete the data element of a subsequent identical value comp(x+1) from the time series. In data that recurs constantly, this allows these data elements to be eliminated from the data set, resulting in high compression.

The compression algorithm can also be executed directly in a floating-point representation of the data. In that case the floating-point number is divided by the smallest distinguishable increment in the reduced representation, then rounded and multiplied again by the smallest distinguishable increment in the reduced representation. Usually, the execution time in the integer representation is lower than in the floating-point representation, so that the use of the integer implementation is faster.

In another exemplary embodiment, the compression algorithm described above can be run in time windows. For example, the time windows can have a fixed length of is or can also be started or ended by external events such as "opening the vehicle" or "closing the vehicle". Typically, a new window starts immediately after the previous window ends. For example, a constant signal is then contained in each window with a data element.

The window length defines both the maximum achievable compression rate and the frequency with which a compressed data set is transferred. Longer windows require a higher maximum compression rate.

The compressed data set can be stored in the computing unit in which the compression was performed. If the data is to be analyzed at an external location, a further measure of the method consists of transferring the compressed data set from the device in which the data set was compressed to an external computing device.

This can be carried out by a public cellular mobile radio communications system or another mobile radio communications system. With the introduction of the 5G mobile communications system, more and more transportation vehicles, machines and systems are using it to connect to the internet. An example of another mobile radio communications system is the WLAN p-system according to the IEEE 802.11p standard, also specified for V2V and V2X communications.

To perform the data analysis it is helpful if the analysis of the decimated time series of the data set is carried out without the need to perform a decompression of the data set.

For a box-plot analysis of the compressed data set this can be carried out in such a way that the decimated time series is sorted by ascending size of the resolution-reduced comp (x) information and that the characteristic values of the box-plot analysis, in particular, minimum value, maximum value, median value, lower quartile and upper quartile, are determined by taking into account the time difference relative to the respective next data element from the compressed data set.

It is possible that data compression and data analysis can be carried out in a common device or in separate devices.

For a device for carrying out the method, it is suggested that the device has at least one computing unit which is designed to acquire measurement values of at least one connected sensor at successive times or to receive the measurement values acquired by the sensor. In addition, it is beneficial if the computing unit forms a time series with the measurement values and associated measuring times, and then to perform at least the operation of rounding with a subsequent decimation of the measurement values of the data elements of the data set contained in the at least one time series. Particularly in the transportation vehicle, it is possible that a sensor is not directly connected to a device for carrying out the method, but that it periodically transmits the data to a device for carrying out the method via a communication bus, e.g., CAN bus. However, this procedure can also be followed in other application areas. Another example is automation technology, in which sensors can be connected to a fieldbus system. The data does not necessarily have to be measurement values from sensors. Time series can also be compiled with calculation results, which are archived as data contents of memory cells in the memory of computing units, i.e., ultimately any information available in digital form in the transportation vehicle. As an example, the calculated average consumption of the transportation vehicle can be mentioned.

It is also helpful if the computing device or a further computing device of the device is designed to carry out a box-plot analysis of the compressed data set, by sorting the decimated time series by ascending size of the resolution-reduced comp(x) information and determining the characteristic values of the box-plot analysis, in particular, minimum value, maximum value, median value, lower quartile and upper quartile, taking into account the time difference relative to the respective next data element from the compressed data set. In this exemplary embodiment, both data compression and data analysis take place in the device. Such devices can be installed in a transportation vehicle.

Thus, a different exemplary embodiment exists in a transportation vehicle that has a disclosed device.

In addition, a further disclosed embodiment consists of a device for carrying out the method, which comprises at least one computing device and is designed to receive the compressed data set. The computing device is designed to perform an analysis of the decimated time series of the data set without the need to perform a decompression of the data set. This device can be deployed in a backend server to which the compressed data sets are transferred.

The computing device can be designed to carry out a box-plot analysis of the compressed data set by sorting the decimated time series by ascending size of the resolution-reduced comp(x) information and selecting the characteristic values of the box-plot analysis, in particular, minimum value, maximum value, median value, lower quartile and upper quartile, from the compressed data set by taking into account the time difference relative to the respective next data element.

Finally, a further disclosed embodiment consists of a computer program which is designed to perform the operations of the method for processing data sets containing at least one time series, as claimed in any one of the disclosed methods, when processed in a computing unit.

The following description illustrates the principles of the disclosed embodiments. It goes without saying, therefore, that persons skilled in the art will be in a position to design different arrangements which, although not explicitly described here, nevertheless embody the principles of the disclosed embodiments and are also intended to fall within its scope of protection.

FIG. 1 shows a system architecture for transportation vehicle communication by mobile radio. The transportation vehicles are designated with reference numeral 10. The transportation vehicles shown are passenger cars. Any other type of vehicle could also be considered as the vehicle, however. Examples of other vehicles are: buses, commercial vehicles, in particular, lorries, agricultural machinery, construction vehicles, camping vehicles, motorcycles, bicycles, scooters, wheelchairs, rail vehicles etc. The use of the disclosed embodiments in transportation vehicles would be possible in general in land vehicles, rail vehicles, waterborne vehicles, and aircraft. In addition, the use of the disclosed embodiments are not limited to transportation vehicles. The use of the disclosed embodiments are generally suitable for practically all areas of electrical engineering. Other examples include machinery and installations, small electrical appliances, consumer electronics devices, white goods, medical devices, etc. This list is not intended to be exhaustive. The connection of devices to the "cloud" is also extending into ever more sectors. A typical byword for this is the term "Internet of Things" (IoT), which represents a trend in technology that more and more devices in industry, commerce and the household are being connected to the internet through the use of modern communication technologies such as 5G.

The transportation vehicles 10 are equipped with an on-board communication module 160 with a suitable antenna unit, so that the transportation vehicle can participate in the various types of transportation vehicle communication, namely vehicle-to-vehicle (V2V) and vehicle-to-infrastructure (V2X). FIG. 1 shows that the transportation vehicle 10 can communicate with the mobile base station 210 of a mobile communications operator.

Such a base station 210 can be an eNodeB base station of an LTE (Long Term Evolution) mobile communications provider or 5G mobile communications provider (5th generation mobile telecommunication system). The base station 210 and its associated equipment are part of a mobile communications network having a plurality of mobile radio cells, each cell being operated from a base station 210.

The base station 210 is typically located near a main road where the transportation vehicles 10 are driving. In addition, the transportation vehicles 10 are each equipped with an on-board communication module 160. This on-board communication module 160 corresponds to an LTE communication module that allows the transportation vehicle 10 to receive mobile data (downlink) and transmit such data in the upward direction (uplink). However, V2V and V2X communication is also supported by the 5th generation of mobile radio systems. There, the corresponding radio interface is called the PC5 interface. With regard to the LTE mobile communications system, the Evolved UMTS Terrestrial Radio Access network E-UTRAN from LTE consists of a plurality of eNodeBs that provide the E-UTRA user layer (PDCP/RLC/MAC/PHY) and the control layer (RRC). The eNodeBs are connected to one another by the so-called X2 interface. The eNodeBs are also connected to the EPC (Evolved Packet Core) 200 via the so-called S1 interface.

From this general architecture, FIG. 1 shows that the base station 210 is connected to the EPC 200 via the S1 interface and that the EPC 200 is connected to the internet 300. A backend server 320, to and from which the transportation vehicles 10 can send and receive messages, is also connected to the internet 300. The backend server 320 can be accommodated in a data center of the transportation vehicle manufacturer or another mobility service provider, or in a data center of a central authority, e.g., a traffic control center. Finally, a road infrastructure station 310 is shown. This can be illustrated, for example, by a unit based on the road, often referred to in the technical jargon as a "Road Side Unit" RSU 310. To simplify the implementation, it is assumed that all components have been assigned an internet address, typically as an IPv6 address, so that the packets that transport messages between the components can be routed appropriately. The various interfaces mentioned are standardized. In this respect, reference is made to the relevant specifications of the mobile telecommunications system, which are published.

Figure 2:
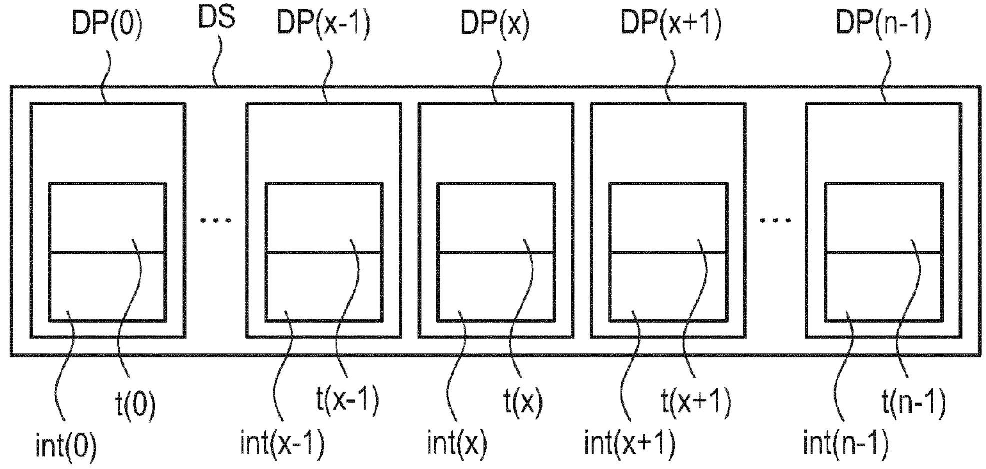
FIG. 2 shows the structure of a data set with a time series and the individual data elements.

FIG. 2 shows an example of the structure of a data set that contains a time series. A time series can correspond to a series of measurements. For example, consecutive measurement values of a physical variable such as temperature, pressure, humidity, speed, duration, rotation speed, acceleration, length, voltage, resistance, light intensity, chemical composition, etc. are detected. In the simplest case, the time series consists of a number of data elements, each of which contains a measurement value and the associated acquisition time. Often the acquisition times will follow one another in equidistant time intervals. However, time series also occur if the measurement values are only acquired sporadically or periodically with variable period duration. FIG. 2 shows a time series with n data elements. The data elements of the time series are designated DP(0) to DP(n−1). Each individual data element contains the measurement value as an integer int(0) to int(n−1) and the respective associated time stamp t(0) to t(n−1), which specifies the respective acquisition time. A characteristic of the time series is that the data elements are sorted according to the acquisition time. Typically, it is even required that the acquisition times must be sorted in a strictly monotonically ascending order. This requirement can be expressed by the relation $t(x)<t(x+1)$. The sensors do not always deliver their measurement values as integers. It will often be the case that the sensors generate analog signals, which are converted into digital signals, for example, via an analog input of a control unit or microcontroller. An analog-to-digital converter is usually used for this purpose, which can also be part of the microcontroller. Conversion tables are then often used to perform the conversion to the physical quantity. However, physical variables are known to be often signed and are specified in specific units, which can result in rational or real numbers that are typically stored in the computer as floating-point numbers. This is usually represented by "single" or "double precision", wherein the "single precision" floating-point number is stored in 32-bit memory locations and the "double precision" floating-point number is stored in 64-bit memory locations. It is always possible to convert floating-point numbers into integers and vice versa. In this regard, reference is made to the following conversion formula for converting from integer to floating-point number:

$$fp(x)=\mathrm{int}(x)*f+o,$$

where fp(x) is the floating-point number, f is a multiplication factor and o is an offset value.

Figure 3:
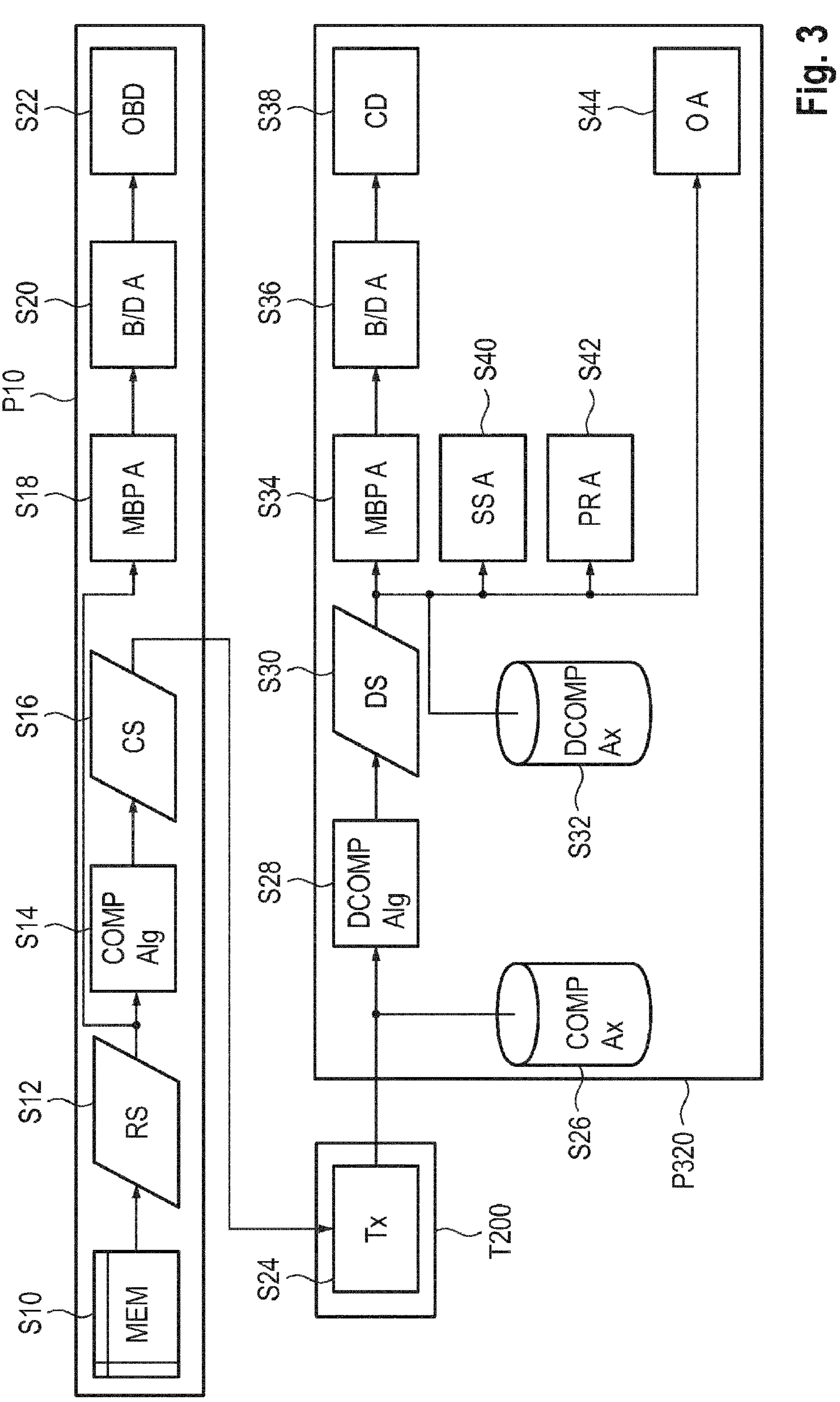
FIG. 3 shows the classical sequence of a process of compressing a data set with transmission to a backend server connected via the internet, followed by analysis of the data set after decompression.

FIG. 3 shows the classical processing sequence of data acquisition in the transportation vehicle and analysis in the transportation vehicle, as well as transmission and storage in the cloud and data analysis in the cloud. The upper part P10 contains the processing operations in the transportation vehicle 10. The middle part T200 contains the operation of transmitting the compressed data sets to the backend server 320 via mobile radio. The lower part P320 contains the processing operations in the cloud. First, the operation in the transportation vehicle 10 will be explained. The measurement value acquisition is not shown separately. Firstly, operation at S10 of storing the data in a memory of a control unit is shown. Operation at S12 consists of reading the data set from memory and feeding the data set to a data compression algorithm. This algorithm is run in operation at S14. As mentioned earlier, a well-known ZIP compression algorithm can be used in operation at S14. In operation at S16, the compressed data set is forwarded to the corresponding on-board communication module 160 of the transportation vehicle 10 for transmission via mobile radio.

There are now applications that require an evaluation of the stored data sets in the transportation vehicle 10. The example cited is the moving box-plot data analysis. A box plot is designed to provide a rapid impression of the region where the data is located and how it is distributed over this region. Therefore, all values of the so-called five-point summary, i.e., the median, the lower quartile (25% quartile), the upper quartile (75% quartile) and the two extreme values minimum and maximum, are determined. These values can be represented very well graphically as a number line with the entries for the five values of the five-point summary. The box-plot representation can be suitable for quickly detecting the condition of wearing parts. In operation at S18, the moving box-plot analysis takes place in the transportation vehicle 10.

Another data analysis method that can be used in the transportation vehicle relates to the break/drift analysis. This is a form of trend analysis. This makes it possible to detect creeping wear and tear. As an example, the wear of the clutch of the transportation vehicle 10 can be mentioned. For this purpose, e.g., the process from selecting the 1st gear of the gearbox of a transportation vehicle with a manual gearbox until the transportation vehicle moves off is measured. The travel of the clutch pedal required to engage the clutch at the moment the transportation vehicle moves off will change slowly as the wear on the clutch increases. The break/drift analysis takes place in operation at S20. In operation at S22, the results of the data analysis are forwarded to the on-board diagnostic unit, which informs the driver of the wear condition of the transportation vehicle 10, e.g., by issuing a warning message on a display unit or by prompting the driver to seek a repair workshop without delay.

It is now important to emphasize that the data analysis processes in the transportation vehicle use the classical method with the uncompressed data. For this reason, FIG. 3 shows that after operation at S12 the uncompressed raw data is forwarded to the data analysis operations at S18 and S22. The data analysis in the transportation vehicle requires processing of all raw data.

After operation at S16, the compressed data sets are transferred via mobile radio to the data center with backend server 320. There, the data sets are archived in compressed form in operation at S26. For data analysis, however, it is necessary to convert the data sets back into a processable form (the original form). A decompression algorithm is used for this purpose in operation at S28. The reconstructed data set is made available to the subsequent data analysis in operation at S30. It is also optionally stored in an archive store for later use, which is indicated by operation at S32. As already explained for the on-board data analysis, the moving box-plot analysis in operation at S34 and the break/drift analysis in operation at S36 can also be performed in the data center. The results are made available to a cloud diagnostic unit, see operation at S38. This unit can ensure that corresponding warning messages are sent back to the transportation vehicle 10 from which the data originates via mobile radio. There are other analysis methods that can be performed in the data center. These include the similarity analysis performed in operation at S40 and the pattern recognition in operation at S42. For more details on the various analysis methods, reference is made to the literature. In operation at S44, additional algorithms can be used for the data analysis.

Figure 4:
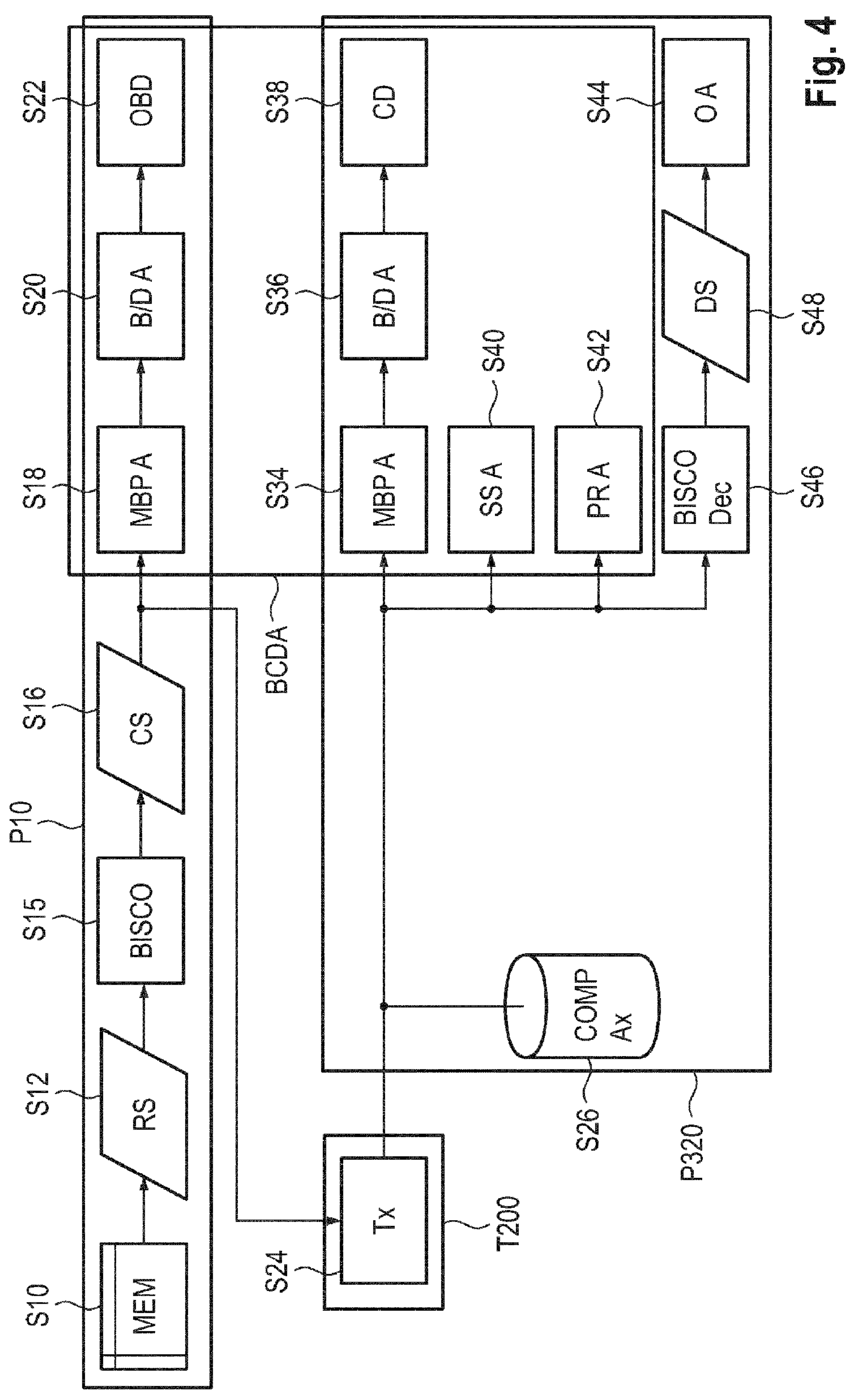
FIG. 4 shows the holistic approach to the process of compressing a data set, which allows a subsequent analysis of the data set after transfer to the backend server without the need for prior decompression.

In comparison to the classical form of data compression, data archiving and data analysis, FIG. 4 shows the process of data acquisition in the transportation vehicle and data analysis in the transportation vehicle, and in the cloud using the disclosed method. Identical reference signs designate the same operations and components as in FIG. 3. A major difference exists in the type of compression applied to the data sets with time series. A compression algorithm is used that allows data analysis on the compressed data. Details of the new compression algorithm will be explained further in the following. This algorithm now allows data analysis with the compressed data. FIG. 4 therefore shows that in operation at S16 the compressed data is passed to the analysis operation at S18. As a result, substantially less data needs to be forwarded and less data also needs to be analyzed, as explained in more detail below. This is equally beneficial for carrying out the archiving and analysis of the data in the "cloud". FIG. 4 therefore shows that operations at S28 to S32 can be omitted. The data analysis is carried out in operations at S34 to S42 with the specially compressed data. It may be the case that a data analysis operation cannot be performed with the specially compressed data. A decompression algorithm is provided for this, which is run in operation at S46. This is possible because the special compression algorithm is also designed to be reversible so that the data can be recovered. The compression algorithm can be configured so that it performs a lossless or lossy compression. If it is configured to be lossy, the original data cannot be recovered without loss of accuracy.

Figure 5:
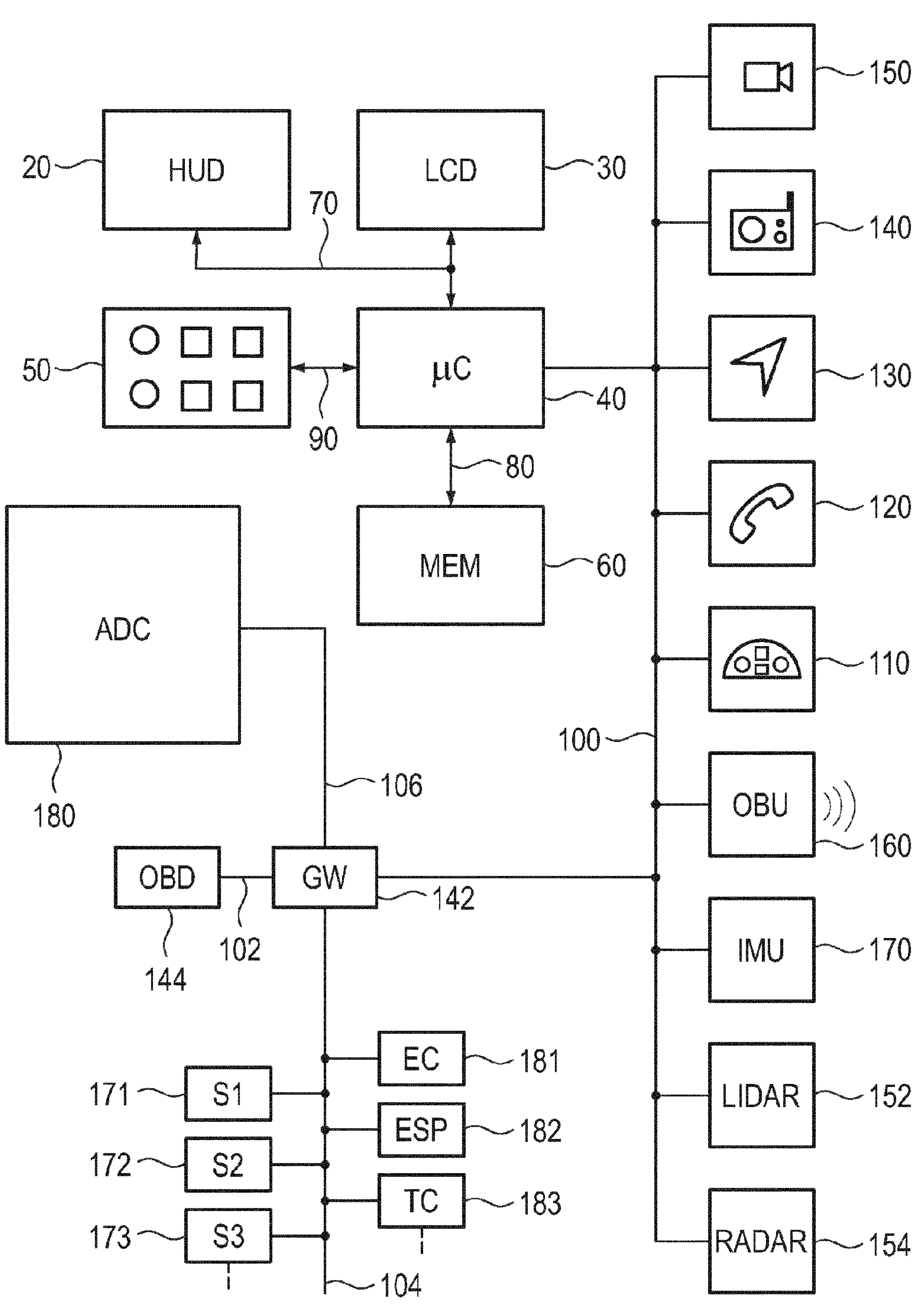
FIG. 5 shows a block circuit diagram of the on-board electronics of a transportation vehicle.

FIG. 5 shows a schematic block diagram of the on-board electronics, which also includes the infotainment system of the transportation vehicle 10. An infotainment system in transportation vehicles, in particular, passenger cars, designates the combination of a car radio, navigation system, speakerphone device, driver assistance systems and other functions in a central control unit. The term infotainment is a portmanteau word, composed of the words information and entertainment. The infotainment system is operated via the touch-sensitive display unit 30, a processing device 40, an input unit 50, and a memory 60. The display unit 30 comprises both a display area for displaying variable graphical information, and a control surface (touch-sensitive layer) positioned above the display area for entering commands by a user. It can be designed as an LCD touch-screen display.

The screen 30 can be easily viewed and operated by a driver of the transportation vehicle 10, but also by a passenger of the transportation vehicle 10. Below the screen 30, mechanical controls such as buttons, rotary knobs or combinations thereof, such as rotary pressure knobs, can also be arranged in an input unit 50. Typically, steering wheel operation of parts of the infotainment system is also possible. This unit is not shown separately, but is considered as part of the input unit 50.

The display device 30 is connected to the processing device 40 via a data line 70. The data line can be designed according to the LVDS standard, corresponding to Low Voltage Differential Signaling. Via the data line 70 the display unit 30 receives control data for controlling the display area of the touch screen 30 from the processing device 40. Via the data line 70, control data from the input commands are also transmitted from the touch screen 30 to the processing device 40. The input unit 50 is connected to the processing unit 40 via the data line 90.

The storage device 60 is connected to the processing device 40 via a data line 80. The memory 60 contains a stored catalog of icons and/or a symbol catalog with the icons and/or symbols for the possible displays of additional information.

In addition, a projection unit 20 is connected to the computing device 40 via the data line 70 and can be designed as a head-up display for projecting "augmented reality" information into the driver's field of view.

The other parts of the infotainment system, the camera 150, radio 140, navigation device 130, telephone 120 and instrument cluster 110, are connected to the device for operating the infotainment system via the data bus 100. The high-speed property of the CAN bus in accordance with ISO standard 11898-2 is a suitable choice for the data bus 100. Alternatively, the use of a bus system based on Ethernet technology, such as BroadR-Reach, is also possible. Bus systems in which the data transmission takes place via fiber-optic cables can also be used. Examples to be cited are the MOST bus (Media Oriented System Transport) or the D2B bus (Domestic Digital Bus). A transportation vehicle measurement unit 170 is also connected to the data bus 100. This transportation vehicle measurement unit 170 is used to detect the motion of the transportation vehicle, in particular, for detecting the accelerations of the transportation vehicle. It can be designed as a conventional IMU unit, corresponding to Inertial Measurement Unit. An IMU unit typically contains accelerometers and yaw rate sensors, such as a laser gyroscope or a magnetometer gyroscope. The transportation vehicle measurement unit 170 can be regarded as part of the odometry of the transportation vehicle 10. This also includes the wheel speed sensors.

It is also noted here that the camera 150 can be designed as a conventional video camera. In this case, it records up to 25 full frames/s, which in the interlaced recording mode corresponds to 50 half-frames/s. Alternatively, a special camera which acquires more frames/s can be used to increase the accuracy of the object detection for faster moving objects, or one which detects light in a spectrum other than the visible spectrum. A plurality of cameras can be used for monitoring the surroundings. In addition, RADAR or LIDAR sensors 152 and 154 are also used as a supplement or as an alternative to carry out or expand the monitoring of the surroundings. For wireless communication internally and externally, the transportation vehicle 10 is equipped with the communication module 160, as already mentioned.

The reference numeral 181 designates an engine control unit. Reference numeral 182 corresponds to an ESP control unit and reference numeral 183 designates a transmission control unit. Other control units, such as an additional dynamic handling control unit (for transportation vehicles with electrically adjustable shock absorbers), airbag control unit, etc., may be present in the transportation vehicle. The networking of such control units, all of which are assigned to the drive train category, typically takes place via the CAN bus system (Controller Area Network) 104, which is standardized by an ISO standard, usually as ISO 11898-1. For various sensors 171 to 173 in the transportation vehicle, which are no longer intended to be connected to individual control units, it is also provided that they are connected to the bus system 104 and that their sensor data is transmitted via the bus to the individual control units. Examples of sensors in transportation vehicles are wheel speed sensors, steering angle sensors, acceleration sensors, yaw rate sensors, tire pressure sensors, distance sensors, knock sensors, air quality sensors, etc. The wheel speed sensors and the steering angle sensors are assigned to the transportation vehicle's odometry system. The acceleration sensors and yaw rate sensors can also be connected directly to the transportation vehicle measurement unit 170.

The reference numeral 144 designates a further on-board diagnostic interface (OBD). This is used to connect a diagnostic device when the transportation vehicle is in the workshop. It allows the fault data stored in the transportation vehicle to be read out. The on-board diagnostic interface 144 is connected to the gateway 142 via the communication bus 102. The gateway 142 is used to enable the exchange of information from the various communication branches. It performs a format conversion, for example, to convert a message it receives in the format of the bus system 100 into the format of the bus system 104. The same process applies to the forwarding operations between the other bus systems of the on-board electronics.

Reference numeral 180 designates an additional control unit that is responsible for an automated driving function or for one or more driver assistance systems. Various driving levels with regard to automated driving can be implemented. A suitably powerful computing unit must be provided in the control unit 180 to implement the desired driving level.

The following text considers the case in which the sensor 171, which is connected to the CAN bus 104, acquires measurement values and transmits them to the gateway 142. The measurement values are archived in the memory of the gateway 142. An example of such a measurement series is shown in tabular form in FIG. 6. However, this is a fabricated series of measurements intended to explain the principle of the compression method. The index of the respective measurement value is entered in the top row. The measurements were made at equidistant time intervals of 10 ms. The second row contains the time indication t(x) when the respective measurement was acquired. The measurement series can be started depending on a specific event. The measurement values were acquired in the range of 0 to 80 ms after the event occurred. The fourth row contains the measurement values fp(x) as decimal numbers with two decimal places. These numbers are transmitted as integers from the sensor 171 via the CAN bus 104 to the gateway 142. The measurement values are in the numerical range from 0.0 to 0.08.

Figures 6, 7:
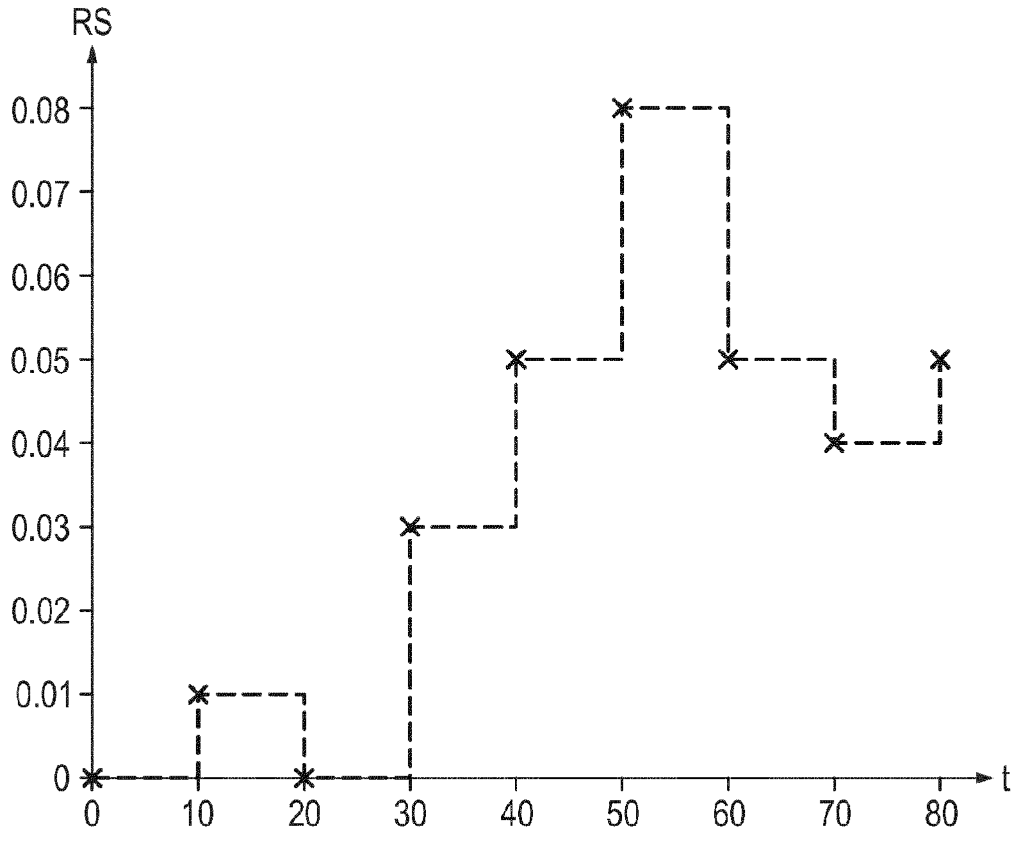
FIG. 6 shows the raw data of a time series of an example data set and its conversion into integers.
FIG. 7 shows a graphical representation of the raw data of the time series in the example of FIG. 6.

FIG. 7 shows the measurement values of the table in FIG. 6 in graphical form. The respective measurement times are plotted along the abscissa of the graph in the range from 0 to 80 ms. The measurement values fp(x) are plotted along the ordinate in the range from 0 to 0.08. The measurement points are illustrated with a cross symbol. The dashed connection between the measurement points corresponds to a staircase function.

The novel compression algorithm, which performs data compression, is processed by a computing unit in the gateway 142. This algorithm is based on rounding of the measurement values by bit shifting. This operation also gives the name to the algorithm known as the BISCO algorithm, corresponding to "BInary Shift COmpression".

Beforehand, the measurement values are converted to integers as required. For signed numbers, the measurement values can be converted to the format of "signed" integers. For unsigned measurement values, the numbers can be converted to "unsigned" integers. This conversion can also be carried out in the gateway 142.

Many sensors already provide the measurement values in integer number format, so that the operation of conversion to integer numbers can be omitted when such sensors are used.

The compression algorithm works with the integer values.

The sequence of the BISCO algorithm is specified here in C++ programming language syntax and consists of 6 actions.

1. set index x=0
2. calculate round information "rnd(x)": rnd(x)=int(x)>>(nbit−1) & 0x1
3. calculate compressed value "comp(x)" with lower accuracy—"nbit" right shift: comp (x)=(int(x)>>nbit)+rnd(x)
4. if "comp(x)" is EQUAL "last" AND x>0: go to 6

5. remember index "x" for transmission. Set "last" to "comp(x)".
6. Increase x=x+1, go to action 2 and continue with next time "t(x+1)" and value "int(x+1)"

In the 1st action, the measurement value index x is set to the initial value 0. In the 2nd action, the rounding information rnd(x) is calculated, to be inserted at the bit position nbit−1 of the integers int(x). This rounding information rnd(x) is calculated by right shifting the integer int(x) by the number nbit−1 digits and logically AND-ing it with the binary value "1". By selecting the nbit parameter, the degree of rounding to be performed can be specified. This is equivalent to choosing the compression level for the compression algorithm. If nbit=0 is chosen, this means that a lossless compression should be performed. In the third action, the compressed value is calculated. The integer int(x) is right shifted by nbit and added to the calculated rounding information rnd(x). The processing sequence of the rounding operation and the resulting rounded values comp(x) are shown in the table in FIG. 8. In the case shown in FIG. 8, nbit=2 was set. In the 2nd action, the integer number is right shifted one digit (nbit−1=1). This position is outlined in the table in FIG. 8 and labeled with rnd. The AND operation results in the rounding information values rnd(x), as specified in the third column of the table in FIG. 8. In the 3rd action, the entry of the integer right shifted by two bit positions is added to the rounding information rnd(x). The results comp(x) are shown in decimal form in the fourth column of the table. In the 4th action, a decimation of the elements is performed on the measurement series. This removes data elements for which the rounded data point comp(x) does not differ from the rounded data point comp (x−1) of the immediate predecessor in time. The support values used are the values decimal 0, decimal 1 and decimal 2. These are thus the values in the table for which the rounded values comp(x) differ from the preceding values comp(x−1).

The progress of the compression algorithm in action 4 to 6 is shown in the additional table in FIG. 9. The support values are given in the fifth row "last". Only these values are retained in the compressed data set and are either stored in the transportation vehicle 10 or forwarded to the on-board communication module 160 and transferred from there to the backend server 320. In the sixth row "transmit", x indicates which data elements of the time series are retained and transferred. The compressed time series is shown in the table in FIG. 10. However, the compressed data set for the compressed time series consists only of the rows t(c) and comp(c). For comparison purposes, the row fp(c) contains the floating-point numbers that result from the rounded comp(x) values of the data elements. The floating-point numbers fp(c) are calculated from comp(c) using the factor fc=2^nbit*f, which corrects the shift by n bits. The factor fc is obtained from the above-mentioned factor f and the selected nbit specification. When the compressed data set is transferred, metadata can also be optionally transferred, if this is not already obtained from other information for the particular application. The information for the factor f, or fc, and the offset value o as well as the nbit specification for the conversion of the integers into floating-point numbers could optionally be transferred at the same time as well as, if required, the physical unit in which the sensor 171 had acquired the values.

The compression is thus obtained by the rounding action in conjunction with the decimation action. Only the support values remain in the time series.

Figure 11:
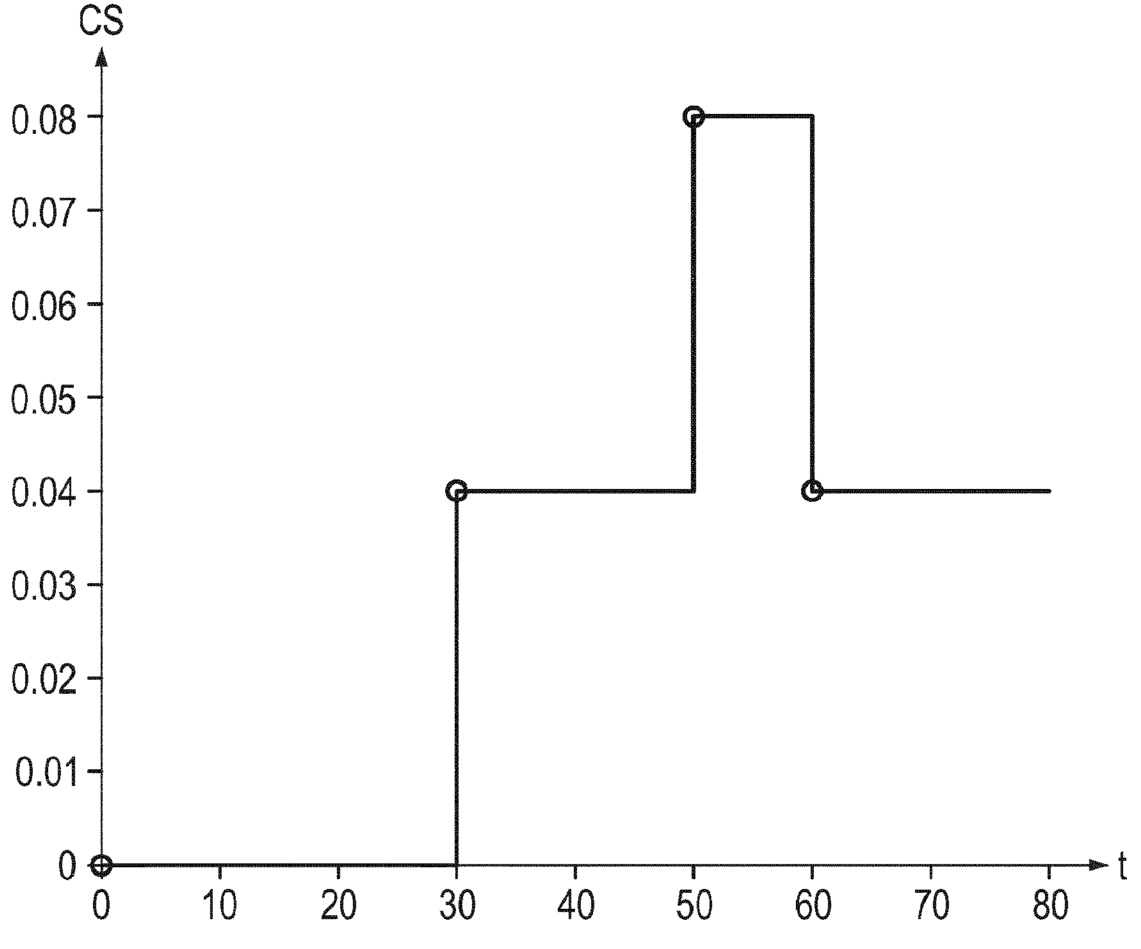
FIG. 11 shows a graphical representation of the time series data of the example of FIG. 6 that remains in the data set after compression.

A graphical representation of the values remaining in the compressed time series is shown in FIG. 11. The remaining support values are shown with circle symbols.

Figure 12:
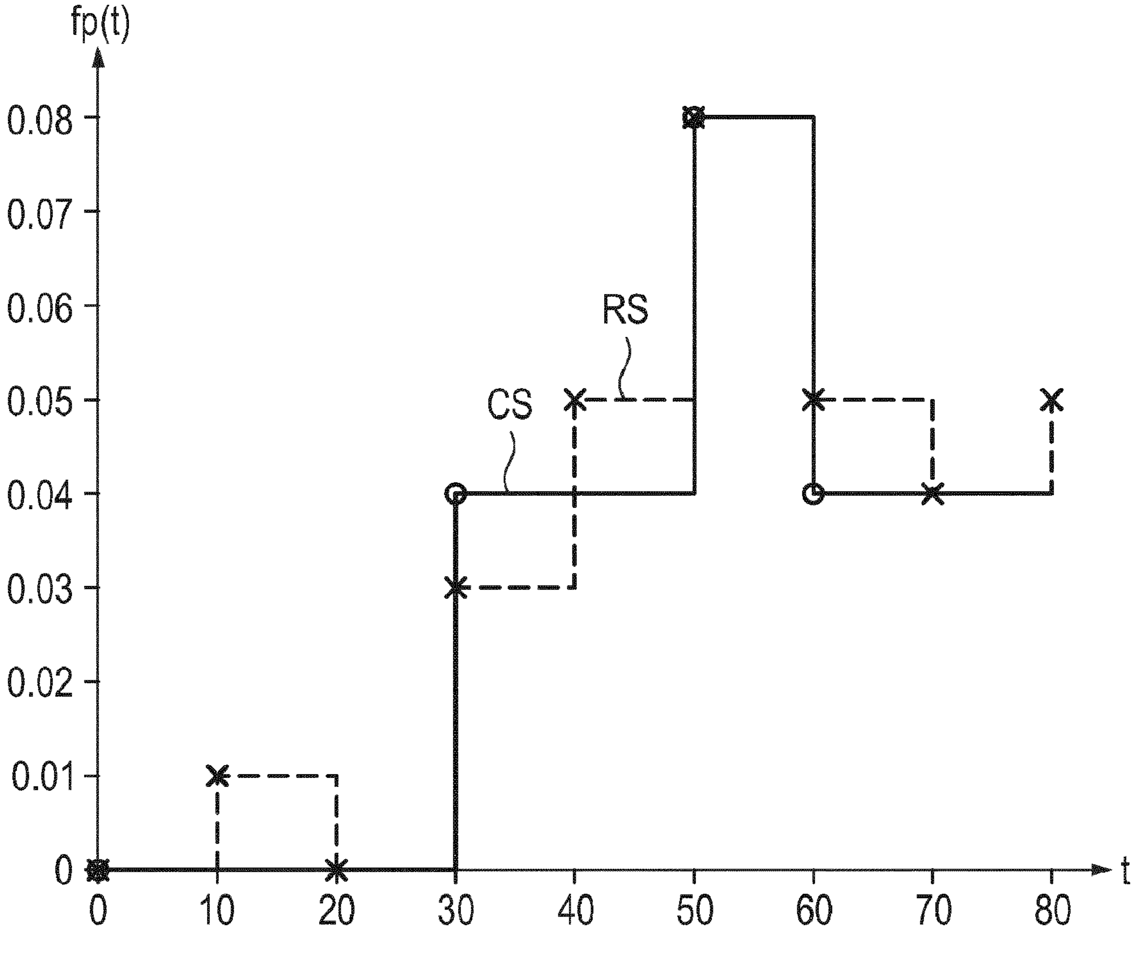
FIG. 12 shows a graphical representation of the compressed data of the time series of the example of FIG. 6 compared to the raw data.

A comparison of the original measurement values and the support values of the compressed representation is shown in FIG. 12. The original measurements, called "Raw Signal" (RS) in FIG. 12, are shown with cross symbols. It can be clearly seen from the diagram that the remaining support values, called "Compressed Signal" (CS) in FIG. 12, do not always correspond to original measurement values, but represent rounded values that can lie between original measurement values.

Next, it will be explained how it is possible to perform data analysis with the data sets compressed in this way without needing to perform a decompression first. The example of the box-plot analysis is chosen to illustrate this.

Figures 13, 14:
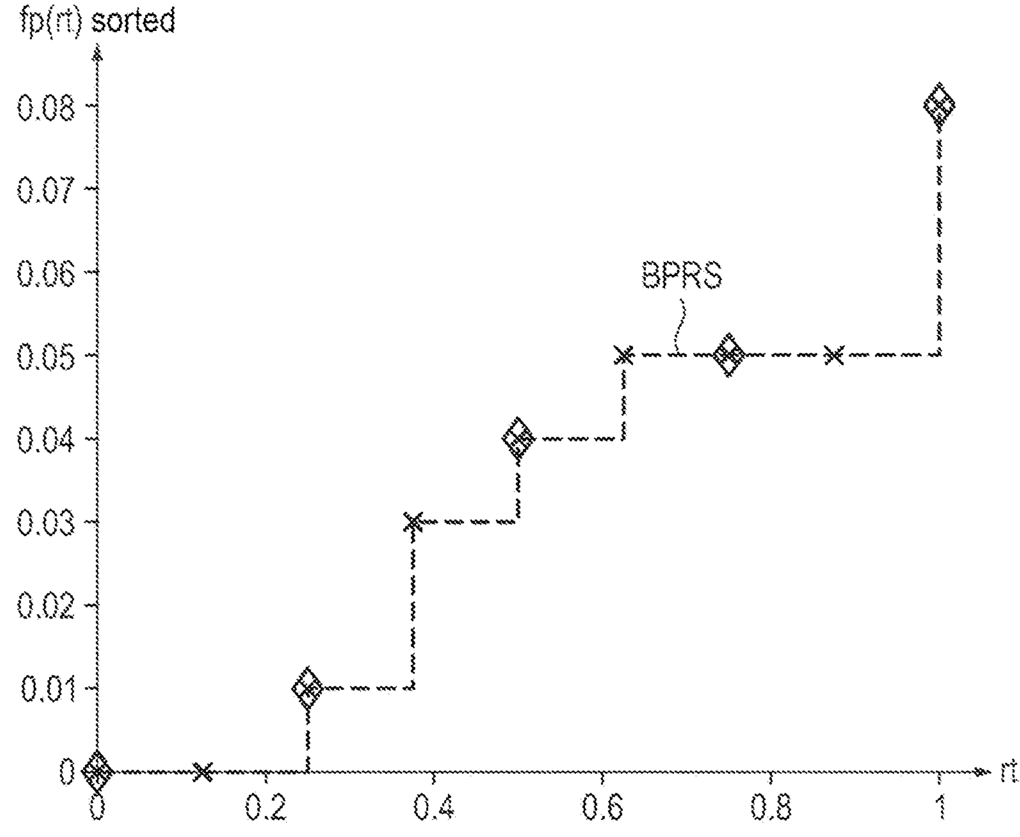
FIG. 13 shows an example of a data analysis as a box-plot analysis applied to the original data set.
FIG. 14 shows a graphical representation of the box-plot analysis of the time series of the example of FIG. 6, applied to the raw data.

First, the result of the box-plot analysis is shown using the example of the original measurement values in FIG. 13. As described above, the box-plot analysis aims to specify the two extreme values of the measurement series, the median value, and the two quartile values Q25 and Q75. All five values are entered in the 3rd column of the table of FIG. 13.

FIG. 14 shows the five result values of the box-plot analysis [Box Plot Raw Signal (BPRS)] in graphical form. The characteristic box-plot analysis values are marked with diamond symbols in FIG. 14.

Figures 15, 16:
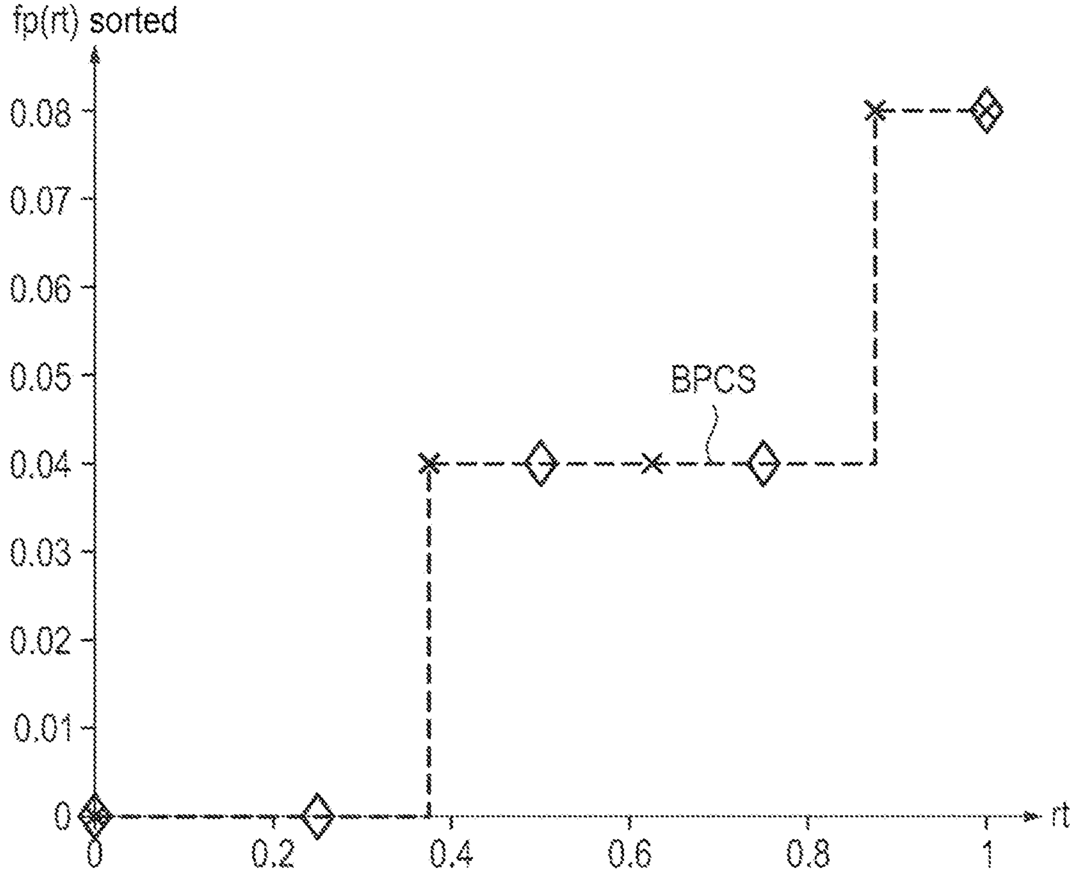
FIG. 15 shows an example of a data analysis as a box-plot analysis applied to the compressed data set.
FIG. 16 shows a graphical representation of the box-plot analysis of the time series of the example of FIG. 6, applied to the compressed data.

FIG. 15 shows in tabular form how the box-plot analysis with the compressed data set works. It is important that the time difference dt to the next data element, which can be easily calculated from the recorded measurement times in the compressed data set, is taken into account. In the box-plot analysis, the time differences are calculated first and added to the data element entries. This is followed by an action of sorting the data elements by ascending size of the compressed integers comp(c). The minimum value of the time series sorted in this way is then located in the first row. It is then analyzed to determine which value (the lower quartile Q25) can be found at 25% of the relative time. The total time covered by the measurement values is 80 ms. This follows from the addition of the values in the dt column. The Q25 value of 20 ms is therefore already located in the first interval between the support values "0" and "1", because according to the table in FIG. 14, the value "0" is present for a period of 30 ms. Therefore, the Q25 value is also entered for the value comp(c)=0. The median value is the value positioned exactly "in the temporal center" of the relative time, i.e., at the relative time 0.5, if the measurement values are sorted by size. Therefore, the median is equal to the value "1", see table in FIG. 15. In principle, the Q75 value is determined in the same way as the Q25 value. In the example, it also corresponds to the value "1" because it is positioned at 75% of the total time represented (corresponding to 60 ms), which is still at the value "1" because the maximum value "2" is only reached after 70 ms, but this corresponds to a relative time of 87.5% of the total time of 80 ms. The 75% value is therefore still "1".

FIG. 16 also shows the results of the box-plot analysis obtained with the compressed data set [Box Plot Compressed Signal (BPCS)]. The sorting and searching effort for the box-plot analysis with the compressed data sets is reduced accordingly. Thousands of measurement values can easily be recorded for real measurement series, so that the effort required for the analysis of the raw data sets increases considerably and therefore the sorting and search effort for the compressed data sets is considerably reduced.

It is also possible to perform other analysis methods on the compressed data sets. Examples include similarity analysis, pattern recognition, and trend analysis. This also includes simple algorithms which process the information for graphical display, such as a bar chart, pie chart, etc. Another example is the histogram display, in which e.g., the relative durations in the different classes are examined.

If an analysis method is not possible with the compressed integer numbers, then a conversion to floating-point numbers can be carried out according to the formula fp(c)=comp(c)*fc+o, as described above. If an analysis method requires temporally equidistant values and/or values of all necessary signals at each time t, this representation can be generated from the compressed representation (decompression). For this purpose, the last valid value at the desired time may be determined for each signal. In principle, these values could also be calculated using other algorithms (e.g., interpolation with linear regression or non-linear regression based on cubic spline functions, etc.).

Data analysis can also be performed by the gateway 142. If a critical deviation from a setpoint is detected, the gateway 142 can send a message to the computing unit 40, which then generates a warning message that is displayed to the driver via the display unit 30 and/or 20. However, the data analysis can also be performed at the backend server 320 to which the compressed data sets were transferred.

All examples mentioned herein, as well as conditional formulations, are to be understood as being without limitation to such specifically mentioned examples. Thus, for example, it will be acknowledged by persons skilled in the art that the block diagram shown here represents a conceptual view of an exemplary circuit arrangement. In a similar way it should be recognized that any illustration of a flow chart, state transition diagram, pseudo-code and the like represents different facets for the purpose of illustrating processes which are essentially stored in computer-readable media and can therefore be executed by a computer or processor.

It should be understood that the proposed method and the associated devices can be implemented in various forms of hardware, software, firmware, special processors or a combination of these. Special processors can comprise application specific integrated circuits (ASICs), Reduced Instruction Set Computers (RISC) and/or Field Programmable Gate Arrays (FPGAs). Optionally, the proposed method and the device are implemented as a combination of hardware and software. The software may be installed as an application program on a software storage device. Typically, this will be a machine based on a computer platform, which has hardware such as one or more central processing units (CPU), a random access memory (RAM) and one or more input/output (I/O) interface(s). In addition, an operating system is typically installed on the computer platform. The various processes and functions which have been described here can either be part of the application program, or executed as part of the operating system.

The disclosure is not limited to the exemplary embodiments described here. There is scope for various adaptations and modifications, which the person skilled in the art due to his expertise would also consider as belonging to the disclosure.

LIST OF REFERENCE SIGNS

10 transportation vehicle
20 head-up display
30 touch-sensitive display unit
40 computing unit
50 input unit
60 memory unit
70 data line to the display unit
80 data line to the memory unit
90 data line to the input unit
100 data bus
102 diagnostic bus
104 CAN bus
106 Ethernet bus
110 instrument cluster
120 telephone
130 navigation device
140 radio
142 gateway
144 on-board diagnostic interface
150 camera
160 communication module
170 transportation vehicle measurement unit
171 sensor 1
172 sensor 2
173 sensor 3
180 control unit for automatic driving function
181 engine control unit
182 ESP control unit
183 transmission control unit
200 Evolved Packet Core
300 internet
310 Road Side Unit
320 backend server
BCDA data analysis with the BISCO-compressed data sets DP(0)–DP(n−1) data element
DS data set int(0)–int(n−1) integer numbers
P10 process operations in the transportation vehicle
P320 process operations in the backend server
S10 storing the raw data set
S12 reading the raw data set
S14 running the compression algorithm
S15 running the BISCO algorithm
S16 forwarding compressed data set
S18 carrying out the box-plot analysis with the raw data
S20 carrying out the break/drift analysis with the raw data
S22 issuing warning messages
S24 transmitting the compressed data set to the cloud
S26 archiving the compressed data set
S28 running the decompression algorithm
S30 forwarding the reconstructed data set
S32 archiving the reconstructed data set
S34 carrying out the box-plot analysis
S36 carrying out the break/drift analysis
S38 generating and transmitting warning messages to the transportation vehicle
S40 carrying out the similarity analysis
S42 carrying out the pattern recognition
S44 carrying out other analysis methods with reconstructed data
S46 running the decompression algorithm
S48 forwarding the reconstructed data set to other analysis methods t(0)–t(n−1) times
T200 transmitting the data sets via mobile radio

The invention claimed is:

1. A method for processing data sets containing at least one time series corresponding to a series of measurement values by a computing unit, wherein the time series contains data acquired at specific times and a respective time of the data acquisition as data elements, the method comprising:

rounding the acquired data with a subsequent decimation of the data elements of the data set contained in the at least one time series;

storing the decimated time series of the data set in the computing unit and/or transferring the decimated time series of the data set to an external computing device; and acquiring the measurement values as integer numbers or as floating-point numbers and converted into integer numbers, wherein, as part of the conversion of the floating-point numbers of the data elements of the time series into integer numbers, an offset "o" is subtracted and the result of the subtraction is divided by a factor.

2. The method of claim 1, wherein the decimation includes examination of a change to the rounded data of the data elements of the time series, and removal of those data elements for which the rounded values are equal to the rounded values of a respective directly temporally adjacent predecessor data element.

3. The method of claim 1, further comprising performing an analysis of the decimated time series of the data set in its compressed data set format without performing a decompression of the data set.

4. The method of claim 3, wherein a box-plot analysis of the compressed data set is carried out by sorting the decimated time series by ascending size of the resolution-reduced comp(x) information and determining the characteristic values of the box-plot analysis taking into account the time difference relative to the respective next data element from the compressed data set.

5. The method of claim 4, wherein the determined characteristic values of the box-plot analysis include minimum value, maximum value, median value, lower quartile and upper quartile.

6. A non-transitory computer readable medium storing a computer program configured to carry out the operations of the method for processing data sets containing at least one time series as claimed in claim 1 when processed in a computing unit.

7. The method of claim 1, further comprising running an algorithm based on a rounding of the integer numbers prior to the decimation of the data elements of the time series.

8. The method of claim 7, wherein the rounding operation is prepared according to the following rule:

$$rnd(x)=AND\ (BSR(int(x),\ nbit-1),\ 1)$$

where rnd(x) corresponds to rounding information of the integer number that is selected for a subsequent rounding operation, where x corresponds to a data element index, where int(x) corresponds to the integer number, where nbit−1 indicates which integer bit position is to be selected for the calculation of the rounding information rnd(x) according to the rule specified above, where AND corresponds to a logical AND operation of the integer value "1" with the entry at the bit position determined by a right shift by the number nbit−1 of bit positions of the integer number int(x).

9. The method of claim 8, wherein the rounding operation is performed according to the following rule:

$$comp(x)=BSR(int(x),\ nbit)+rnd(x),$$

where comp(x) corresponds to the resolution-reduced portion of the integer number int(x) resulting from the rounding, where nbit is the number of bit positions by which the integer number is right-shifted before the addition with the rounding information rnd(x) is performed.

10. The method of claim 9, wherein, as part of the decimation of the time series data elements, the rounded values comp(x) and comp(x−1) are compared with each other and a following identical value of comp(x) is deleted from the time series.

11. A device for processing data sets containing at least one time series corresponding to a series of measurement values, wherein the time series contains data acquired at specific times and a respective time of the data acquisition as data elements, the device comprising:

at least one computing unit configured to acquire a measurement value of at least one connected sensor or to receive measurement values acquired by the sensor at successive times;

wherein the computing unit forms at least one time series with the measurement values and associated measurement times, wherein the computing unit rounds the acquired data with a subsequent decimation of the data elements of the data set contained in the at least one time series, wherein the decimated time series of the data set is stored in the computing unit and/or transferred to an external computing device, wherein the measurement values are acquired as integer numbers or as floating-point numbers and converted into integer numbers, and wherein, as part of the conversion of the floating-point numbers of the data elements of the time series into integer numbers, an offset "o" is subtracted and the result of the subtraction is divided by a factor.

12. The device of claim 11, wherein the device or a further computing device carries out a box-plot analysis of the data set in a compressed data set format, by sorting the decimated time series by ascending size of the resolution-reduced comp(x) information and determining the characteristic values of the box-plot analysis taking into account the time difference relative to the respective next data element from the compressed data set.

13. The device of claim 12, wherein the determined characteristic values of the box-plot analysis include minimum value, maximum value, median value, lower quartile and upper quartile.

14. A transportation vehicle comprising the device of claim 11.

15. The device of claim 11, further comprising at least one computing device configured to receive the data set in its compressed format, wherein the computing device carries out an analysis of the decimated time series of the data set in its compressed format without needing to perform a decompression of the data set.

16. The device of claim 15, wherein the at least one computing device configured to receive the compressed data set carries out a box-plot analysis of the compressed data set by sorting the decimated time series by ascending size of the resolution-reduced comp(x) information and determining the characteristic values of the box-plot analysis taking into account the time difference relative to the respective next data element from the compressed data set.

17. The device of claim 15, wherein the determined characteristic values of the box-plot analysis include minimum value, maximum value, median value, lower quartile and upper quartile.

* * * * *